(12) United States Patent
Green et al.

(10) Patent No.: US 7,364,966 B2
(45) Date of Patent: Apr. 29, 2008

(54) METHOD FOR FORMING A BURIED DIGIT LINE WITH SELF ALIGNING SPACING LAYER AND CONTACT PLUGS DURING THE FORMATION OF A SEMICONDUCTOR DEVICE, SEMICONDUCTOR DEVICES, AND SYSTEMS INCLUDING SAME

(75) Inventors: James E. Green, Nampa, ID (US); Terrence B. McDaniel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 304 days.

(21) Appl. No.: 11/208,972

(22) Filed: Aug. 22, 2005

(65) Prior Publication Data
US 2007/0040224 A1 Feb. 22, 2007

(51) Int. Cl.
*H01L 21/8242* (2006.01)
(52) U.S. Cl. ........... 438/253; 438/396; 257/E21.646
(58) Field of Classification Search ........ 438/253–256, 438/369–399; 257/E21.646
See application file for complete search history.

(56) References Cited

U.S. PATENT DOCUMENTS

| | | | |
|---|---|---|---|
| 5,053,351 A * | 10/1991 | Fazan et al. ............ | 438/240 |
| 5,250,457 A | 10/1993 | Dennison ................ | 438/253 |
| 6,093,947 A | 7/2000 | Hanafi et al. ........... | 257/330 |
| 6,309,933 B1 | 10/2001 | Li et al. ................. | 438/291 |
| 6,391,720 B1 | 5/2002 | Sneelal et al. .......... | 438/259 |
| 6,677,646 B2 | 1/2004 | Ieong et al. ............. | 257/347 |
| 6,790,738 B2 | 9/2004 | Clampitt ................. | 438/381 |
| 6,838,375 B2 | 1/2005 | Hu ........................ | 438/649 |
| 2005/0260813 A1* | 11/2005 | Shea ..................... | 438/256 |

OTHER PUBLICATIONS

J.M. Hergenrother et al, "The Vertical Replacement-Gate (VRG) MOSFET: A 50-nm Vertical MOSFET with Lithography-Independent Gate Length", Bell Laboratories, Lucent Technologies 0-7803-5413 1999 IEEE.
Copending US application: "Semiconductor Structures, and Methods of Forming Semiconductor Constructions," Terrence B. McDaniel et al., filed Apr. 6, 2005, U.S. Appl. No. 11/099,972.

* cited by examiner

*Primary Examiner*—Richard A. Booth

(57) ABSTRACT

A method for use during fabrication of a semiconductor device comprises the formation of buried digit lines and contacts. During formation, a buried bit line layer may be used as a mask to etch one or more openings in a dielectric layer. A conductive layer is then formed in the one or more openings in the dielectric layer, and is then planarized to form one or more individual contact plugs. Next, the buried bit line layer is etched to recess the buried bit line layer, and a capacitor plate is formed to contact the contact plug.

16 Claims, 10 Drawing Sheets

METHOD FOR FORMING A BURIED DIGIT LINE WITH SELF ALIGNING SPACING LAYER AND CONTACT PLUGS DURING THE FORMATION OF A SEMICONDUCTOR DEVICE, SEMICONDUCTOR DEVICES, AND SYSTEMS INCLUDING SAME

FIELD OF THE INVENTION

This invention relates to the field of semiconductor manufacture and, more particularly, to a buried digit line and method for forming a buried digit line, and a system including the buried digit line.

BACKGROUND OF THE INVENTION

Miniaturization of semiconductor devices such as memory devices, logic devices, and microprocessors is an ever present goal of processing engineers and design engineers. Increasing the density of devices decreases costs, for example by increasing device yields and by decreasing material costs.

Semiconductor devices such as dynamic random access memory (DRAM) devices, and other devices comprising random access memory (RAM), typically comprise a word line which forms part of a gate for a transistor, a storage capacitor (typically a container capacitor) which stores an electrical charge, and a digit line (bit line) which is used to store, erase, and read a charge on the storage capacitor.

A container capacitor is typically formed by etching a patterned opening to expose a doped region in a semiconductor wafer (or to expose a conductive pad which contacts the doped region) then forming a polysilicon layer within the opening to provide a polysilicon capacitor plug which contacts the doped region (or the conductive pad). A capacitor bottom plate is formed to contact the polysilicon plug, and a capacitor cell dielectric and a capacitor top plate are formed in proximity to the bottom plate.

The digit line has been conventionally formed at a level above that of the completed storage capacitor. To form a conventional digit line, a patterned opening is etched through a dielectric layer to expose a doped region of a semiconductor wafer substrate assembly, a plug is formed in the opening, then the digit line is formed to contact the plug. However, with decreasing device sizes the width of the container capacitor decreases and thus the height of the capacitor must be increased to maintain an adequate capacitance. A digit line formed at a level above the storage capacitor requires the plug opening to have a severe height: width ratio (i.e. a severe "aspect ratio"), possibly 10:1 or more, which is difficult to achieve. Further, accomplishing a complete fill of the opening with metal to form the digit line plug is also difficult and may leave a plug with one or more voids and a high electrical resistance. Instead of etching completely through a thick dielectric layer to expose a doped region in the semiconductor wafer, the aspect ratio required for the digit line plug may be reduced somewhat by forming a contact pad prior to dielectric formation which contacts the doped region of the wafer, then etching the dielectric to expose the contact pad during the etch of the plug opening. The digit line plug opening, therefore, must be etched deep enough to expose the contact pad rather than etching down to the semiconductor wafer. However, this advantage provided by the plug is negated as the feature size is further decreased because of the requirement for an even taller container capacitor.

To overcome problems with the conventional digit line structure, including the high aspect ratio opening which must be completed to form the digit line plug, buried digit line processes have been developed. A buried digit line is formed at a level below the level of the storage capacitor, and thus no high aspect opening is required for the digit line plug to the doped wafer region. Buried digit line structures are described in U.S. Pat. Nos. 5,250,457 by Dennison, 6,790,738 by Clampitt, and 6,838,375 to Hu, each of which is assigned to Micron Technology, Inc. and incorporated herein as if set forth in their entirety.

To prevent contact between the buried digit line and other conductive features, the conductive digit line layer is formed, patterned, and etched, then a conformal blanket dielectric spacer layer, typically silicon nitride, is formed and etched using an anisotropic spacer etch, thereby resulting in dielectric spacers along sidewalls of the buried digit line. While the spacer is required to prevent contact with adjacent conductive features, it adds to the lateral space required on the semiconductor wafer. As two spacers are typically required for each digit line, and there are several thousand digit lines in a typical DRAM device, the spacers may require considerable space on the semiconductor device.

In the processes described above, a first patterned mask is needed to etch the polysilicon plug of the container capacitor and a second patterned mask is needed to etch the digit lines. Both of these masks are critical and have scant processing latitude. Patterning of these layers is subject to mask misalignment, which may result in undesirable contact between conductive features and an unreliable or nonfunctional device. Thus, reducing the number of critical masking patterns is a goal of semiconductor processing engineers.

A method for forming a semiconductor device which has a reduced number of required patterned masks and eliminates the need for discrete spacers around the digit line would be desirable, as would the resulting semiconductor device and systems formed using the device.

SUMMARY OF THE INVENTION

The present invention provides a method which, among other advantages, reduces the number of precisely-aligned masks required to form a semiconductor device, and further eliminates spacers which are typically required to electrically insulate buried digit lines. In accordance with one embodiment of the invention, a semiconductor wafer substrate assembly, which may include one or more contact pads, is completed up to the point of forming buried digit lines. A first dielectric layer is formed, then a thinner second dielectric layer is formed, with the two dielectric layer being formed from materials which may be etched independently (each layer may be etched selective to the other). The first and second dielectric layers are both etched with a vertical anisotropic etch using single mask layer down to the level of the contact pads, but leaving unetched the first dielectric layer located directly over the contact pads. Subsequently, a selective isotropic etch such as a wet etch is performed using an etchant which removes the second dielectric layer at a faster rate than it etches the first dielectric layer and, preferably, which does not etch the first dielectric layer.

Next, a buried digit line layer, such as tungsten, is formed within the openings in the first and second dielectric layer, for example using a damascene process (i.e. a blanket deposition over horizontal surfaces and extending into the openings, followed by a mechanical planarization, such as chemical mechanical planarization or "CMP," to remove the buried digit line layer from horizontal surfaces of the second dielectric layer). A mask is formed which has a very large processing latitude, then a vertical etch of the second and first dielectric layers is performed using the tungsten buried digit line layer as a hard mask to expose the contact pads. A conductive layer such as doped polysilicon is formed within the openings to contact the contact pads, and any conductive material across the horizontal surface is removed, for example using CMP, to form a polysilicon capacitor plug.

Finally, the buried digit line layer is recessed within the remaining first dielectric layer, and a blanket third dielectric layer is formed and planarized to provide a dielectric cap over the digit line layer. Wafer processing then continues to complete the semiconductor device, for example by providing a container capacitor bottom plate to contact the polysilicon plug, a capacitor cell dielectric, and a container capacitor top plate.

Advantages resulting from use of the inventive method to form a semiconductor device, semiconductor devices, and systems incorporating same will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which may be determined by one of skill in the art by examination of the information herein.

DETAILED DESCRIPTION OF THE ILLUSTRATED EMBODIMENTS

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but could be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

A first embodiment of an inventive method for forming two conductive structures using a single precision mask is depicted in the cross sections of FIGS. 1-13. The FIGS. and description herein describe the formation of a buried digit line and a container capacitor, although it is contemplated that conductive features having other functions may be formed using an embodiment of the present invention.

Figure 1:
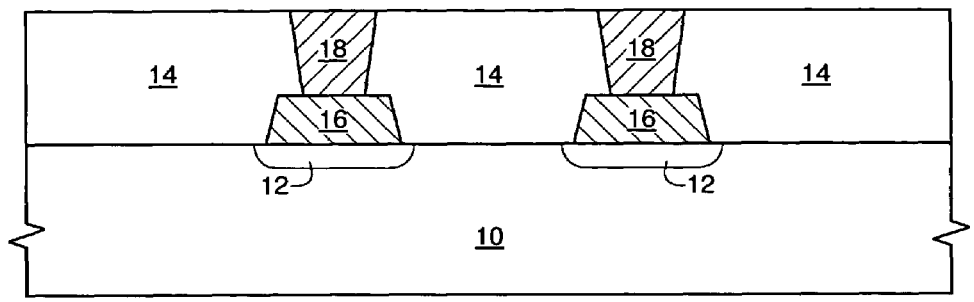
FIGS. 1-13 are cross sections depicting in-process structures formed during implementation of an embodiment of the method of the present invention.

FIG. 1 depicts a starting structure of the present embodiment which may be formed by one of ordinary skill in the art from the description herein. FIG. 1 depicts a semiconductor wafer 10 comprising conductive implanted regions 12, and one or more dielectric layers 14 having epitaxial features 16 separated by the dielectric layer 14, and polysilicon features 18 formed therein. In this embodiment, conductive structures 16, 18 will provide part of an electrical pathway between a container capacitor bottom plate and the doped regions 12 in wafer 10. Polysilicon features 18 provide contact locations for polysilicon capacitor plugs which are formed later, and are separated by noncontact locations of the dielectric layer 14. The polysilicon capacitor plugs will contact the polysilicon features 18 and a container capacitor bottom plate.

After forming the FIG. 1 structure a first planarized dielectric layer 20 and a second planarized dielectric layer 22 are formed over the surface of layers 14 and 18. The material of these two layers is selected such that each layer may be etched selective to the other layer (i.e. with no etching or minimal etching of the other layer). For example, layer 20 may be tetraethyl orthosilicate (TEOS) or silicon nitride ($Si_3N_4$), while layer 22 may be phosphosilicate glass (PSG) or borophosphosilicate glass (BPSG). In this descriptive embodiment, layer 20 will be a TEOS layer between about 10 Å and about 10,000 Å thick, while layer 22 will be a BPSG layer between about 10 Å and about 10,000 Å thick. After forming layers 20, 22, a patterned mask 24 is formed which covers layers 18, 20, and 22 to complete the FIG. 2 structure. This mask is the only one having a minimal processing latitude for this embodiment.

Figure 2:
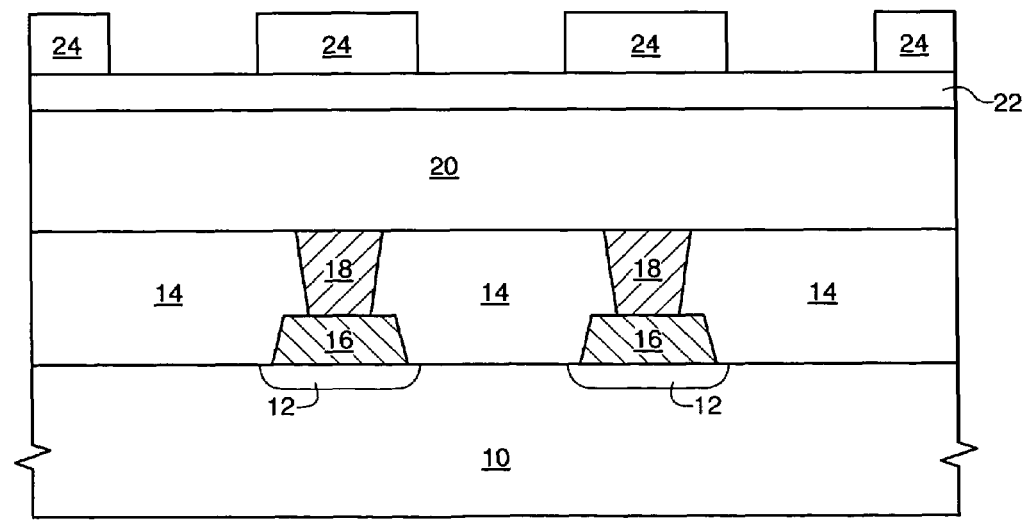
Figure 3:
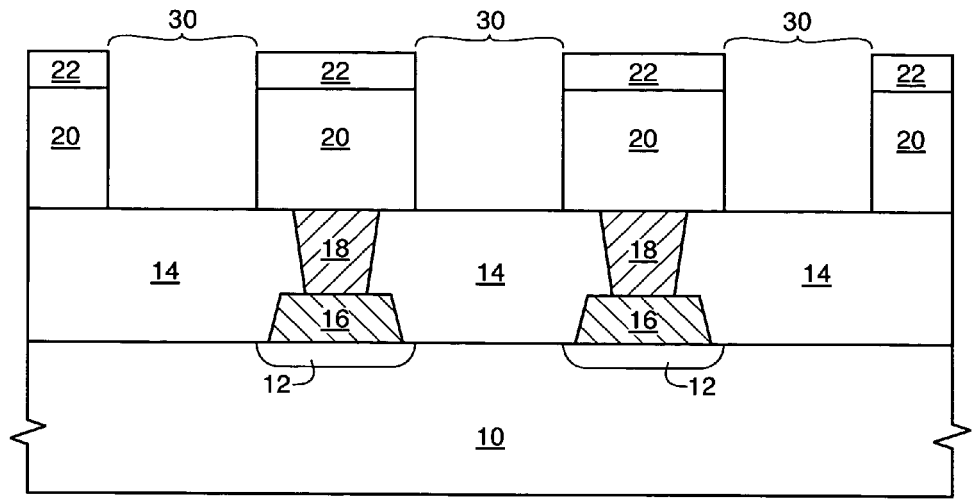

A vertical anisotropic etch of the FIG. 2 structure is performed to remove layers 20, 22 and to expose layer 14. This etch may also expose digit line plugs formed at other wafer locations. After this etch of the FIG. 2 structure, polysilicon structures 18 remain covered by dielectric 20 as depicted in FIG. 3. A vertical anisotropic etch which removes both BPSG and TEOS comprises the introduction of one or more gasses, for example one or more of octafluorocyclobutane ($C_4F_8$), trifluoromethane ($CHF_3$), difluoromethane ($CH_2F_2$), tetrafluoromethane ($CF_4$), argon, or a similar gas into an etch chamber at a flow rate of between about 250 standard $cm^3$ (sccm) and about 500 sccm. During this etch the chamber is maintained at a pressure of between about 1 millitorr (mT) and about 300 mT and a temperature of between about 0° C. and about 100° C. As the present etch removes BPSG and TEOS at a rate of between about 1 Å/second and about 1,000 Å/second, the etch is performed for between about 1 seconds and about 200 seconds, or just until layer 14 is exposed. After the etch, the mask 24 is removed to result in the structure of FIG. 3 having openings 30 in layers 20, 22. These process conditions and times depend on the critical dimensions, stack heights, doping, etc., and may be modified and optimized for individual processes and etch gasses and conditions.

Figure 4:
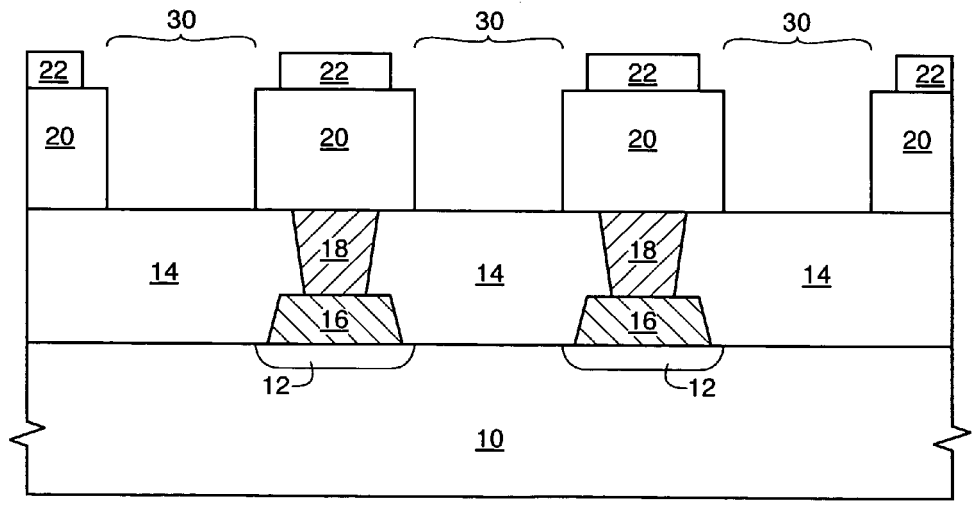

After forming the FIG. 3 structure, an isotropic etch of layer 22 is performed to pull back layer 22 and to form a lip from dielectric layer 20 as depicted in FIG. 4. An isotropic etch which removes BPSG selective to TEOS includes a wet etch using QEtch II (1% phosphoric acid, 39% ammonium fluoride) or hydrofluoric acid. The degree of pullback, which reduces the width of layer 22 relative to layer 20, depends on the required thickness of the subsequently formed spacing portions formed from etching layer 20 which are needed to adequately insulate a buried digit line from a capacitor polysilicon plug. Thicker spacing portions require more pullback, while thinner spacing portions require less pullback. Further, any unavoidable lateral etching during subsequent processing acts must be considered. In this embodiment, the width of the two centrally depicted portions of layer 22 in FIG. 4 is reduced from a beginning width of between about 700 Å and about 1,000 Å, to an ending width of between about 500 Å and about 700 Å.

Figure 5:
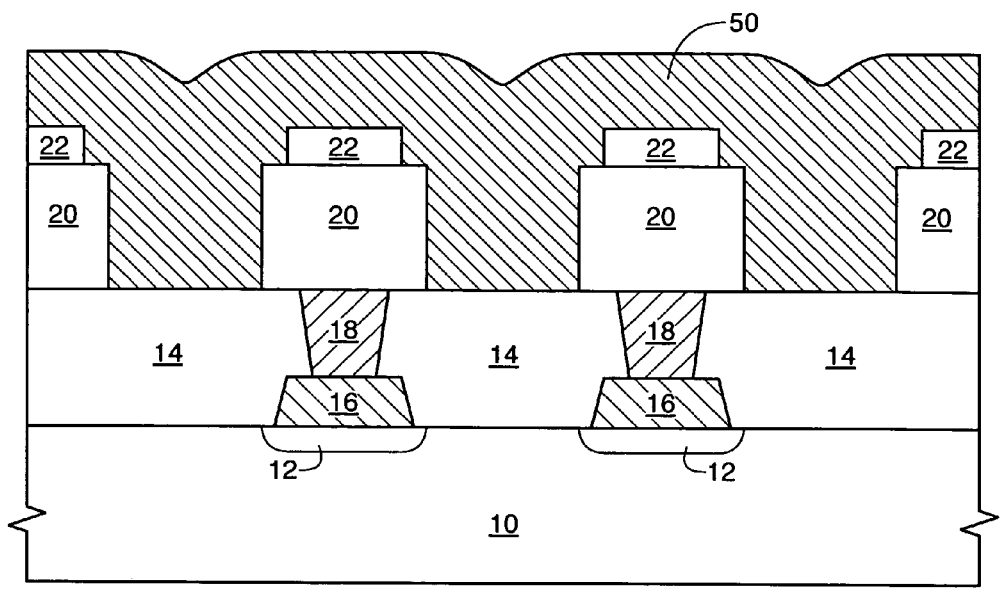
Figure 6:
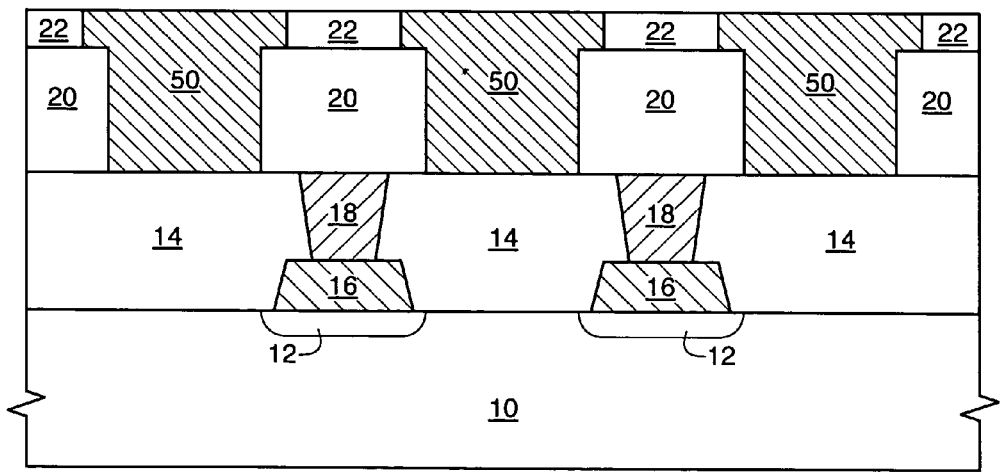

After forming the FIG. 4 structure, a blanket buried digit line layer 50 is formed over the surface of the FIG. 4 structure and within openings 30 to result in the FIG. 5 structure. Layer 50 may be formed to contact digit line plugs present, but not individually depicted, in the FIG. 1 structure. In this embodiment, layer 50 is a tungsten layer between about 50 Å and about 1,000 Å thick. Layer 50 may be formed by chemical vapor deposition (CVD) according to techniques known in the art. Layer 50 is then planarized using etching or, preferably, mechanical planarization such as chemical mechanical planarization (CMP) to form individual damascene buried digit line features 50 as depicted in FIG. 6. FIG. 6 depicts the upper surface of conductive layer 50 and the upper surface of dielectric layer 22 forming a planarized surface.

Figure 7:
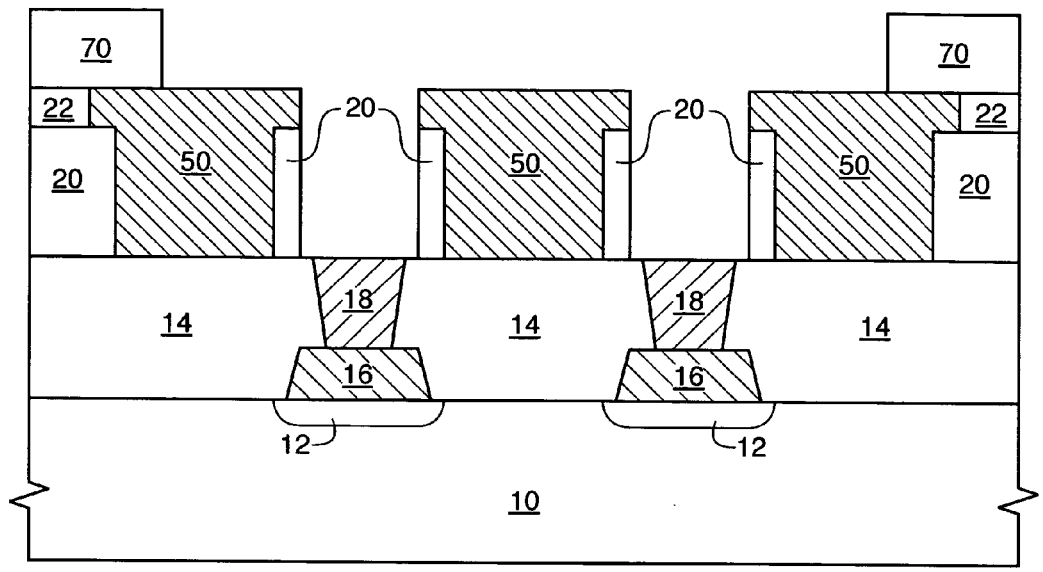

Next, a mask 70, which has significant processing latitude, is formed as depicted in FIG. 7 to cover regions of the structure surface where etching of layer 22 or other exposed layers is to be avoided. This mask 70 is noncritical as it may be misaligned by up to half the width of feature 50 without adverse processing consequences. Mask 70 will leave exposed other regions of layer 22, particularly regions which overlie polysilicon features 18. A vertical anisotropic etch is performed which etches layers 22 and 20 selective to tungsten layer 50 and polysilicon layer 18 and forms cross sectional spacing portions as depicted in FIG. 7 from layer 20. In this embodiment, this etch of layers 22 and 20 should have as minimal lateral etching of layer 20 as possible to ensure that spacing portions 20 as depicted in FIG. 7 remain along the entire pre-etched height of layer 20. Portions of conductive bit line layer 50 which are formed over the lip of layer 20 function as an etch mask during this etch so that spacing portions 20 as depicted in FIG. 7 remain.

It should be noted that the spacing portions 20 within each opening of FIG. 7 are depicted as isolated first and second spacing portions, while they may be, in actuality, a single continuous spacing portion within each opening due to the openings being, typically, round oval, ovoid, square, or rectangular in shape. For purposes of this disclosure, spacing portions may be referred to as "first and second cross sectional spacing portions" but may be two portions of one continuous feature.

An etch which removes TEOS with little lateral etching and further removes BPSG selective to tungsten and polysilicon comprises introducing at least one of $CF_4$, $CHF_3$, $CH_2F_2$, or a similar gas into an etch chamber at a flow rate of between about 1 sccm and about 1,000 sccm. During this etch the chamber is maintained at a pressure of between about 1 mT and about 300 mT and a temperature of between about 0° C. and about 100° C. As the present etch removes BPSG and TEOS at a rate of between about 1 Å/second and about 1,000 Å/second, the etch is performed for between less than one second and about 500 seconds, or just until layer 18 is exposed. These parameters may be modified and optimized as necessary by one of ordinary skill in the art for individual process flows.

Figure 8:
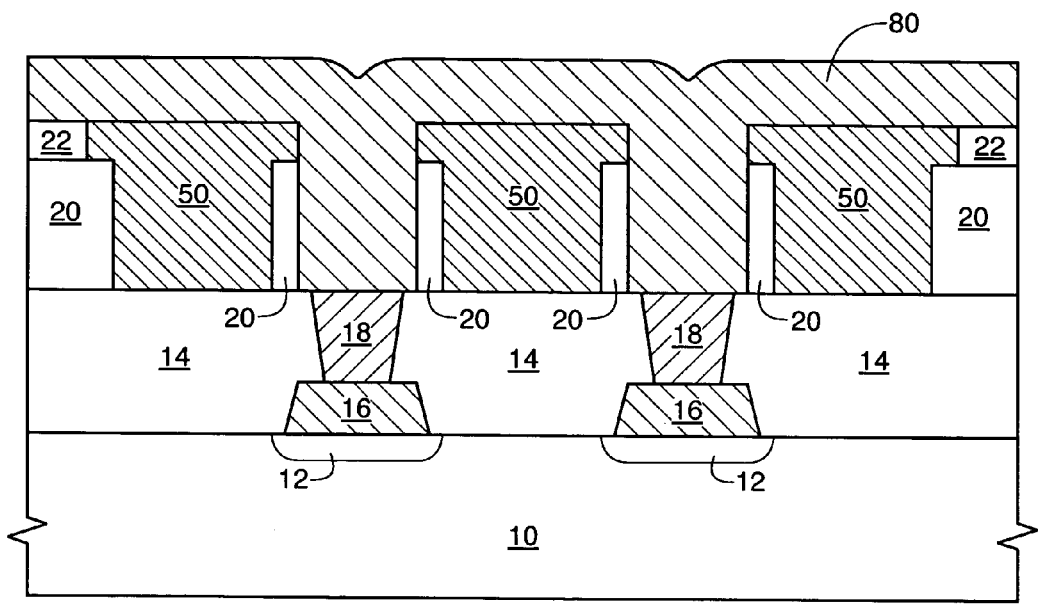
Figure 9:
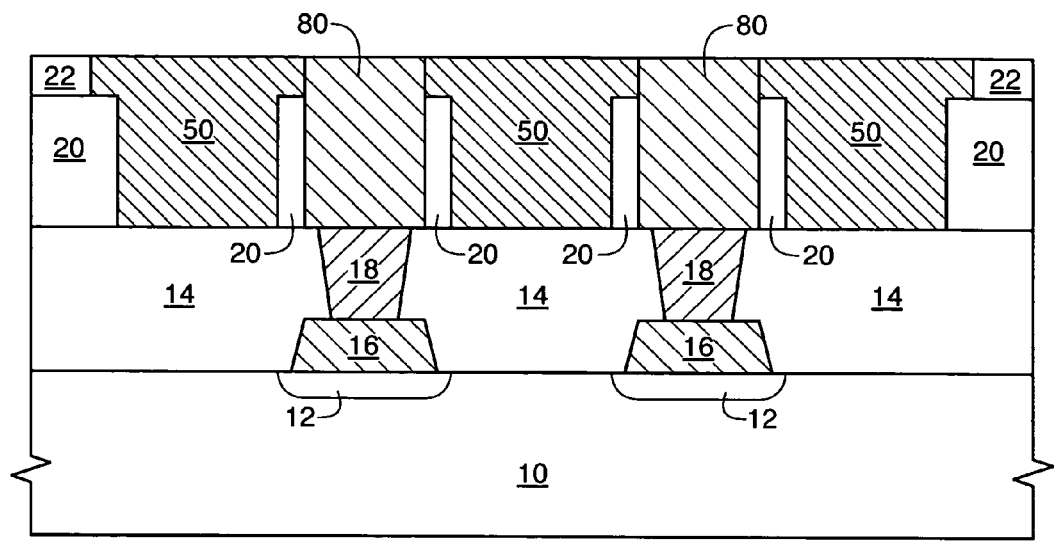

After forming the FIG. 7 structure, mask 70 is removed and a conductive layer 80 such as a doped polysilicon layer is formed over the surface and within the openings as depicted in FIG. 8. Layer 80 contacts and is electrically shorted to polysilicon pads 18 at this point in the process. Subsequently, the portions of layer 80 overlying layers 50 and 22 are removed, for example using a vertical etch or, more preferably, using CMP to result in damascene polysilicon features 80 as depicted in FIG. 9. At this point, layers 50 and 80 contact each other laterally and are electrically shorted. Further, layer 50 is electrically shorted to doped wafer region 12 by epitaxial features 16, polysilicon layer 18, and polysilicon feature 80.

Next, an etch is performed to recess tungsten digit line layer 50 to below the upper surface of dielectric layer 20 to result in the structure of FIG. 10. This electrically isolates digit line layer 50 from polysilicon layer 80, and thus isolates layer 50 from layers 18, 16, and 12. This etch removes the portions of conductive bit line layer 50 formed over the lip of layer 20 and which functioned as an etch mask during the etch of layer 20 which resulted in the FIG. 7 structure. Thus this portion of the bit line which functioned as the etch mask for layer 20 is sacrificial, as it is removed subsequent to its use as an etch mask without adverse process consequences. An etch which removes tungsten selective to all other exposed layers (dielectric layers 20, 22 and polysilicon layer 80) includes ammonia ($NH_3$) as a wet etch and sulfur hexafluoride ($SF_6$) as a dry etch.

Figure 10:
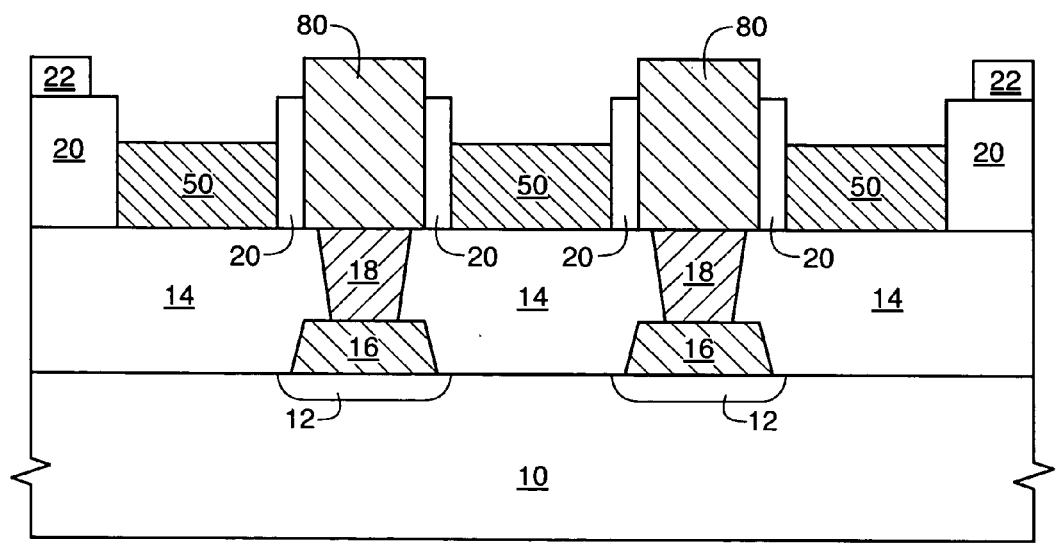
Figure 11:
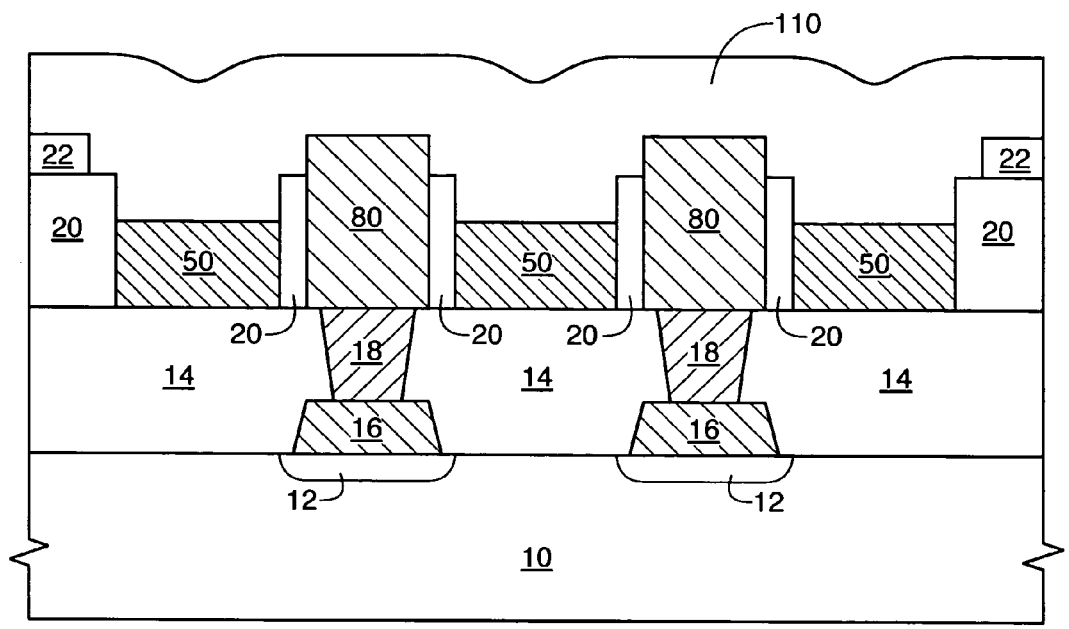

Subsequent to forming the FIG. 10 structure, a dielectric layer 110 such as silicon nitride is formed over the surface of the FIG. 10 structure to result in the FIG. 11 structure. A planarization process, such as an isotropic or anisotropic etch or, preferably, a CMP process, is performed on the FIG. 11 structure to result in the structure of FIG. 12. The FIG. 12 structure depicts buried digit lines 50 which are electrically isolated from capacitor polysilicon plugs 80.

Figure 12:
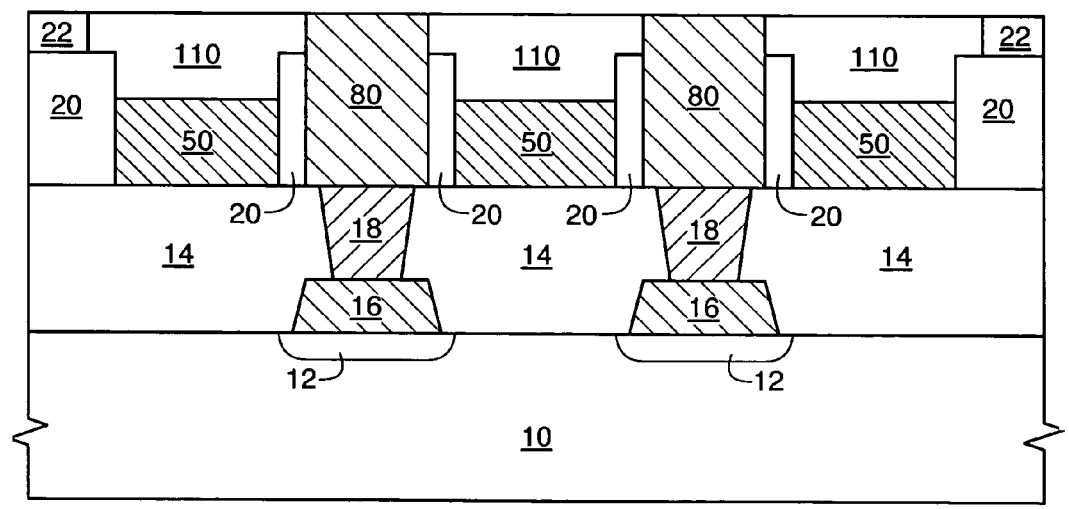
Figure 13:
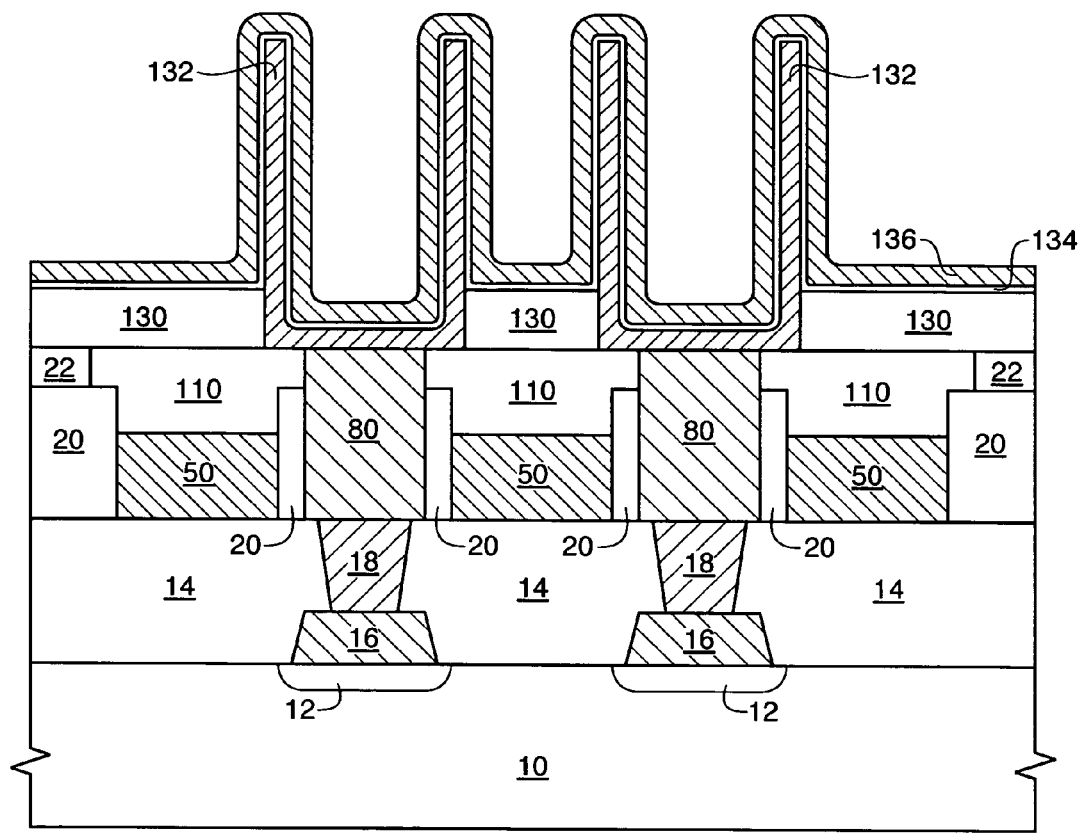

Wafer processing then continues according to techniques known in the art, for example to form the container capacitor structure of FIG. 13. In addition to the elements depicted in FIG. 12, FIG. 13 depicts the following structures: dielectric layer 130, container capacitor bottom plate 132, capacitor cell dielectric 134, and capacitor top plate 136. Each container capacitor bottom plate 132 contacts one of plugs 80, and is electrically coupled with doped wafer region 12 through epitaxial layer 16, polysilicon layer 18, and one of plugs 80.

The first etch of layer 20, which results in the FIG. 3 structure, may provide solid features which will typically be round, oval, ovoid, square, or rectangular in shape when viewed from the top down, although other shapes are possible. These solid features 20 of FIG. 3 are defined by outside sidewalls formed during the first etch. The second etch of layer 20, which results in the FIG. 7 structure, forms an opening within the previously solid structures. These hollow features 20 of FIG. 7 are further defined by inside sidewalls formed during the second etch.

Figure 14:
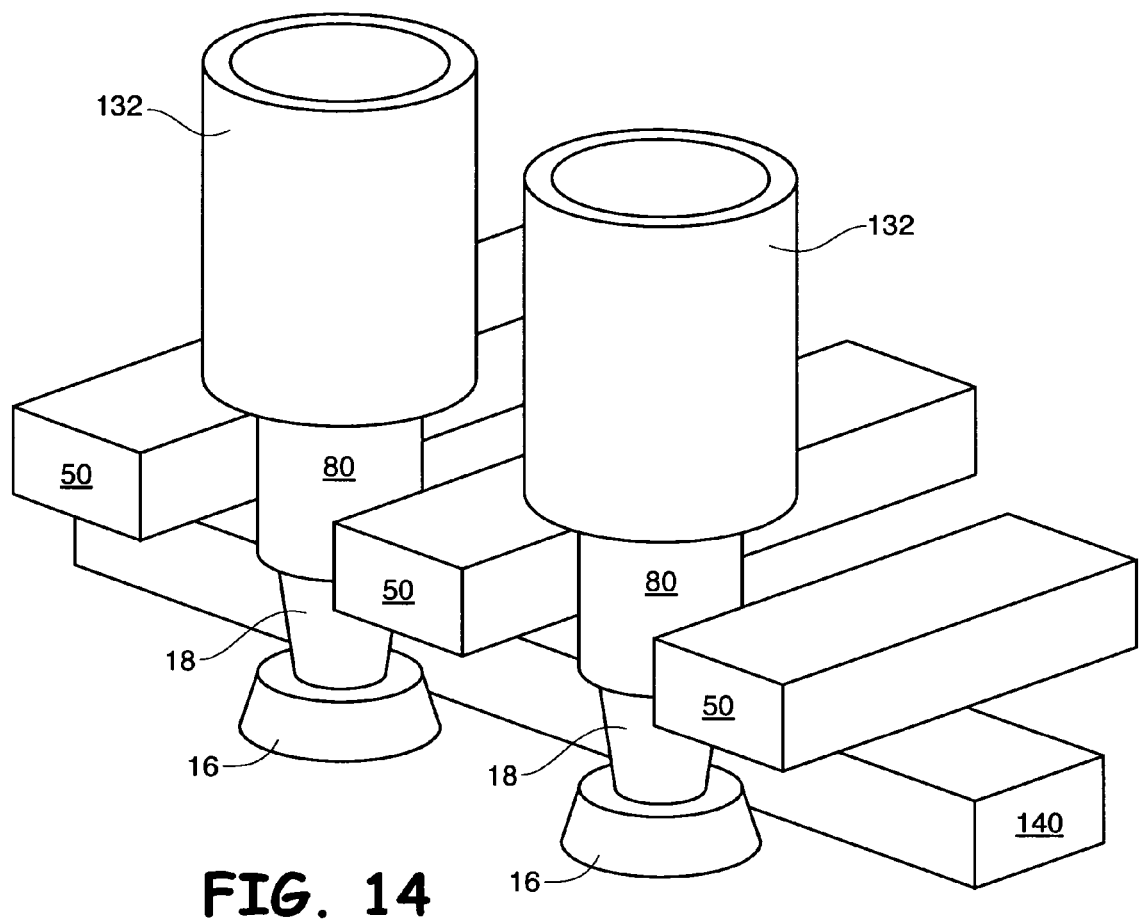
FIG. 14 is an isometric depiction of one contemplated arrangement of a portion of the conductive components of the FIG. 13 structure.

FIG. 14 is an isometric depiction showing one possible arrangement of some of the conductive features of FIG. 13, specifically epitaxial features 16, polysilicon features 18, buried digit line 50, damascene polysilicon capacitor plugs 80, and container capacitor bottom plate 132. FIG. 14 also depicts a word line 140 which is not depicted in the cross section of FIG. 13.

Figure 15:
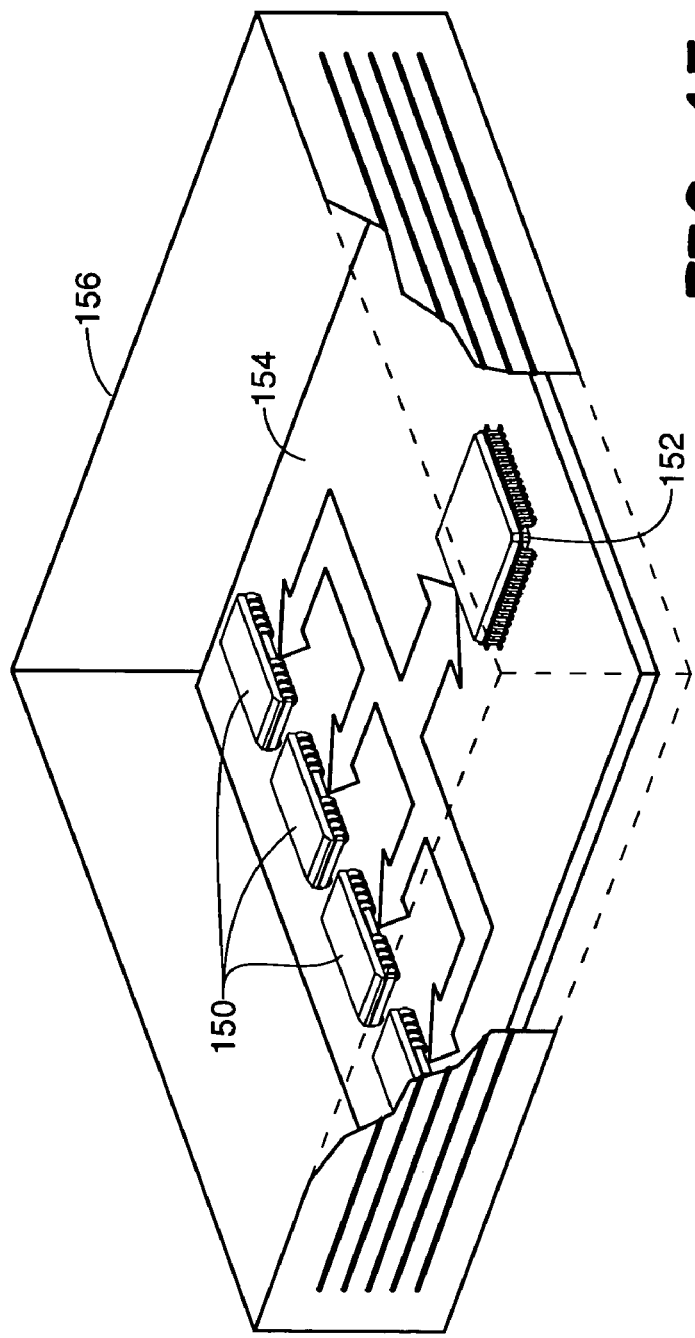
FIG. 15 is an isometric depiction of various components of an electronic system which may be manufactured using devices formed according to an embodiment of the present invention.

As depicted in FIG. 15, a semiconductor device 150 formed in accordance with the invention may be attached along with other devices such as a microprocessor 152 to a printed circuit board 154, for example to a computer motherboard or as a part of a memory module used in a personal computer, a minicomputer, or a mainframe 156. FIG. 15 may also represent use of device 150 in other electronic devices comprising a housing 156, for example devices comprising a microprocessor 152, related to telecommunications, the automobile industry, semiconductor test and manufacturing equipment, consumer electronics, or virtually any piece of consumer or industrial electronic equipment.

Figure 16:
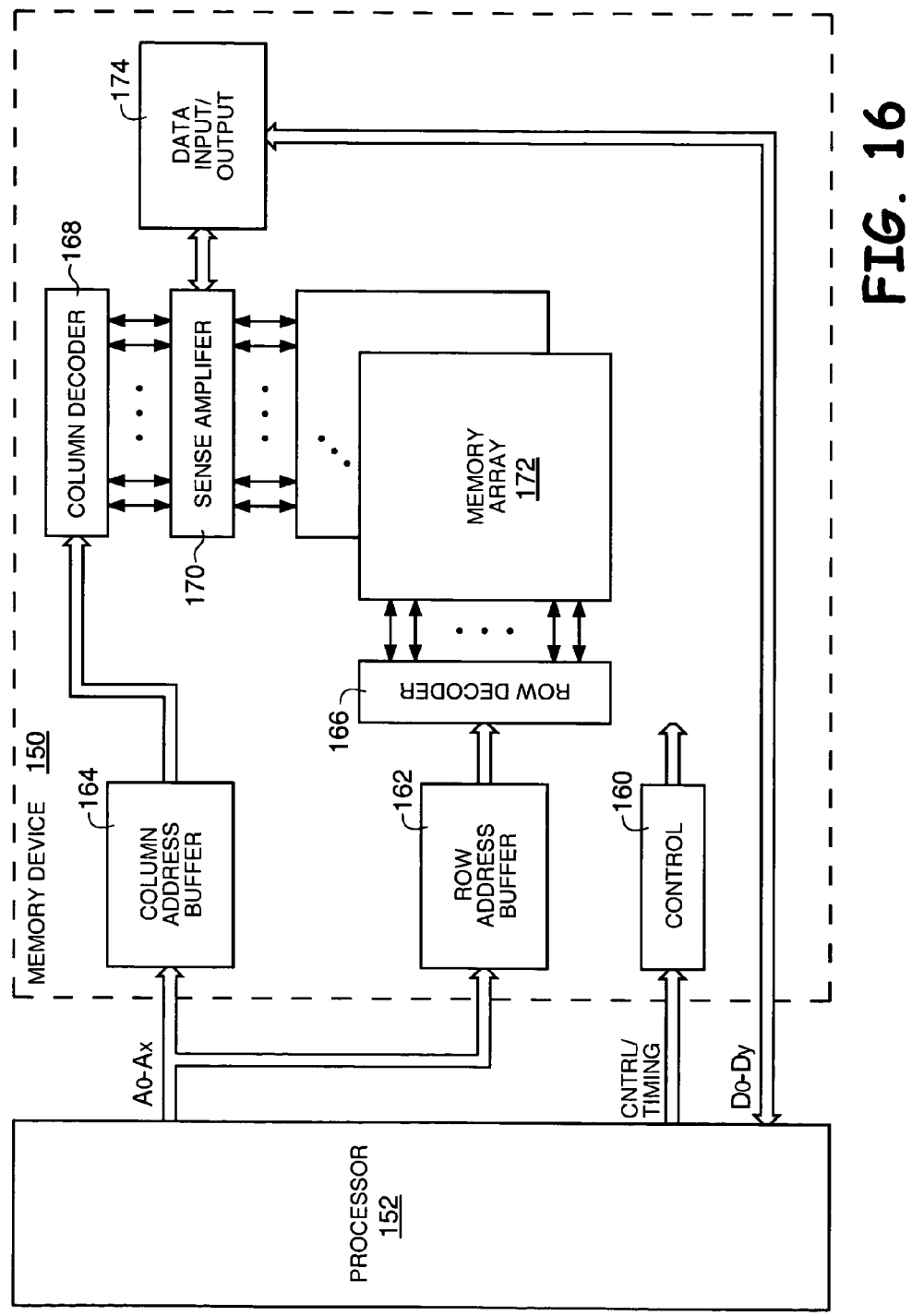
FIG. 16 is a block diagram of an exemplary use of the invention to form part of a memory device having a storage transistor array such as may be used in an electronic system as depicted.

The process described herein may be used to manufacture a number of different structures comprising a metal layer formed according to the inventive process to result in a densified metal layer having decreased resistance and reduced contamination compared with conventional layers. FIG. 16, for example, is a simplified block diagram of a memory device such as a dynamic random access memory having container capacitors and other features which may be formed using an embodiment of the present invention. The general operation of such a device is known to one skilled in the art. FIG. 16 depicts a processor 152 coupled to a memory device 150, and further depicts the following basic sections of a memory integrated circuit: control circuitry 160; row 162 and column 164 address buffers; row 166 and column 168 decoders; sense amplifiers 170; memory array 172; and data input/output 174.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method for use during fabrication of a semiconductor device, comprising:
    providing a semiconductor wafer substrate assembly comprising a first region having a contact location and a second region free from the contact location;
    forming a first dielectric layer comprising a first material over the first region and over the second region;
    forming a second dielectric layer comprising a second material different from the first material over the first dielectric layer and over the first and second regions;
    performing a first etch of the second dielectric layer and the first dielectric layer to form a first opening in the first and second dielectric layers and to expose the second region;
    etching the second dielectric layer selective to the first dielectric layer to expose a surface of the second dielectric layer and to form a lip from the first dielectric layer;
    forming a first conductive layer within the opening in the first and second dielectric layers in contact with the second region and the lip formed from the first dielectric layer;
    performing a second etch of the second and the first dielectric layers to form a second opening in the first dielectric layer and to expose the contact location in the first region using the first conductive layer which contacts the lip as an etch mask for the first dielectric layer;
    forming a second conductive layer in the second opening in the first dielectric layer in contact with the contact location of the first region; and
    etching the first conductive layer to recess the first conductive layer within the first opening in the first dielectric layer and to remove the first conductive layer from contact with the lip of the first dielectric layer.

2. The method of claim 1 further comprising:
    planarizing the first dielectric layer prior to forming the second dielectric layer; and
    planarizing the second dielectric layer prior to recessing the first conductive layer within the first opening in the first dielectric layer.

3. The method of claim 1 further comprising shorting the first conductive layer to the contact location during the formation of the second conductive layer.

4. The method of claim 1 further comprising shorting the first conductive layer to a doped region within a semiconductor wafer during the formation of the second conductive layer.

5. The method of claim 4 further comprising shorting the first conductive layer to the doped region within the semiconductor wafer through at least one conductive contact pad during the formation of the second conductive layer.

6. The method of claim 1 further comprising:
    selecting a target width for the lip of the first dielectric layer;
    during the etch of the second dielectric layer selective to the first dielectric layer, removing an amount of the second dielectric layer in relation to the selected target width for the lip of the first dielectric layer with an isotropic etch.

7. A method for use during fabrication of a semiconductor device, comprising:
    forming a first dielectric layer;
    forming a second dielectric layer on the first dielectric layer;
    etching the second dielectric layer selective to the first dielectric layer to pull back the second dielectric layer from the first dielectric layer and to form a lip from the first dielectric layer;
    forming a conductive layer on the lip of the first dielectric layer; and
    etching the first dielectric layer using the conductive layer on the lip of the first dielectric layer as an etch mask.

8. The method of claim 7 further comprising etching both the second dielectric layer and the first dielectric layer during the etch of the first dielectric layer using the conductive layer the lip of the first dielectric layer as an etch mask.

9. The method of claim 7 further comprising etching the conductive layer from the lip of the first dielectric layer subsequent to etching the first dielectric layer using the conductive layer as an etch mask.

10. The method of claim 9 further comprising configuring the conductive layer for use as a digit line.

11. The method of claim 10 wherein the conductive layer is a first conductive layer and the method further comprises forming a second conductive layer adapted to contact a container capacitor bottom plate, wherein, with the first conductive layer on the lip of the first dielectric layer, the second conductive layer is shorted to the first conductive layer.

12. A method for use during fabrication of a semiconductor device, comprising:
forming a first dielectric layer;
forming a second dielectric layer on the first dielectric layer;
etching the first and second dielectric layer to form at least one solid structure from the first dielectric layer defined by first dielectric layer outside sidewalls;
etching the second dielectric layer selective to the first dielectric layer to expose a first dielectric layer lip;
forming a mask layer on the first dielectric layer lip; and
etching the first dielectric layer using the mask layer as a mask to form an opening within the solid structure and to form inside sidewalls from the first dielectric layer.

13. The method of claim 12 further comprising configuring the mask layer as a conductive layer adapted for use as a digit line.

14. The method of claim 13 wherein the conductive layer is a first conductive layer and the method further comprises forming a second conductive layer within the opening in the first dielectric layer in contact with the first conductive layer.

15. The method of claim 14 wherein the second conductive layer is adapted to contact a container capacitor bottom plate.

16. A method for use during fabrication of an electronic system, comprising:
providing a semiconductor device, comprising:
providing a semiconductor wafer substrate assembly comprising a first region having a contact location and a second region free from the contact location;
forming a first dielectric layer comprising a first material over the first region and over the second region;
forming a second dielectric layer comprising a second material different from the first material over the first dielectric layer and over the first and second regions;
performing a first etch of the second dielectric layer and the first dielectric layer to form a first opening in the first and second dielectric layers and to expose the second region;
subsequent to etching the second and the first dielectric layers, etching the second dielectric layer selective to the first dielectric layer to expose a surface of the second dielectric layer and to form a lip from the first dielectric layer;
forming a first conductive layer within the opening in the first and second dielectric layers in contact with the second region and the lip formed from the first dielectric layer;
performing a second etch of the second and the first dielectric layers to form a second opening in the first dielectric layer and to expose the contact location in the first
region using the first conductive layer which contacts the lip as an etch mask for the first dielectric layer;
forming a second conductive layer in the second opening in the first dielectric layer in contact with the contact location of the first region; and
etching the first conductive layer to recess the first conductive layer within the first opening in the first dielectric layer and to remove the first conductive layer from contact with the lip of the first dielectric layer.

* * * * *